United States Patent
Bernard et al.

(10) Patent No.: US 7,471,652 B2
(45) Date of Patent: Dec. 30, 2008

(54) REAL-TIME RF/IF SIGNATURE TRIGGER

(75) Inventors: Kyle L. Bernard, Tigard, OR (US); Koichi Sega, Ageo (JP)

(73) Assignee: Tektronix, Inc., Beaverton, OR (US)

( * ) Notice: Subject to any disclaimer, the term of this patent is extended or adjusted under 35 U.S.C. 154(b) by 748 days.

(21) Appl. No.: 11/015,962

(22) Filed: Dec. 16, 2004

(65) Prior Publication Data

US 2006/0133263 A1    Jun. 22, 2006

(51) Int. Cl.
*H04B 7/00* (2006.01)
(52) U.S. Cl. .................. 370/310; 375/142; 375/150; 375/343
(58) Field of Classification Search ............ 370/208, 370/210, 310; 375/316, 340, 343, 346
See application file for complete search history.

(56) References Cited

U.S. PATENT DOCUMENTS

| 4,096,397 | A |   | 6/1978 | Dreiling |
| 4,797,936 | A |   | 1/1989 | Nakatsugawa et al. |
| 4,843,309 | A |   | 6/1989 | Kareem |
| 2004/0176921 | A1 | * | 9/2004 | Lacy et al. .................. 702/78 |
| 2006/0015277 | A1 |   | 1/2006 | Bernard |
| 2008/0019464 | A1 | * | 1/2008 | Kloper et al. ............... 375/340 |

* cited by examiner

*Primary Examiner*—Ajit Patel
(74) *Attorney, Agent, or Firm*—Francis I. Gray; Michael A. Nelson

(57) ABSTRACT

An RF/IF signature trigger for acquiring received RF signal data is generated by correlating the received RF signal data in the form of a time domain RF/IF signal, a detected RF/IF signal and/or a frequency domain RF/IF signal with a reference signal defined by a signal signature record representing desired/undesired RF/IF signal patterns, detected RF pulse shapes, special RF markers used specifically for triggering signal acquisitions, particular signal patterns of interest and the like. The resulting correlation factor continuously calculated in real time is compared with a variable correlation threshold such that when the correlation factor reaches the variable correlation threshold, either positive or negative, the RF/IF signature trigger is generated to acquire the received RF signal data for analysis.

24 Claims, 1 Drawing Sheet

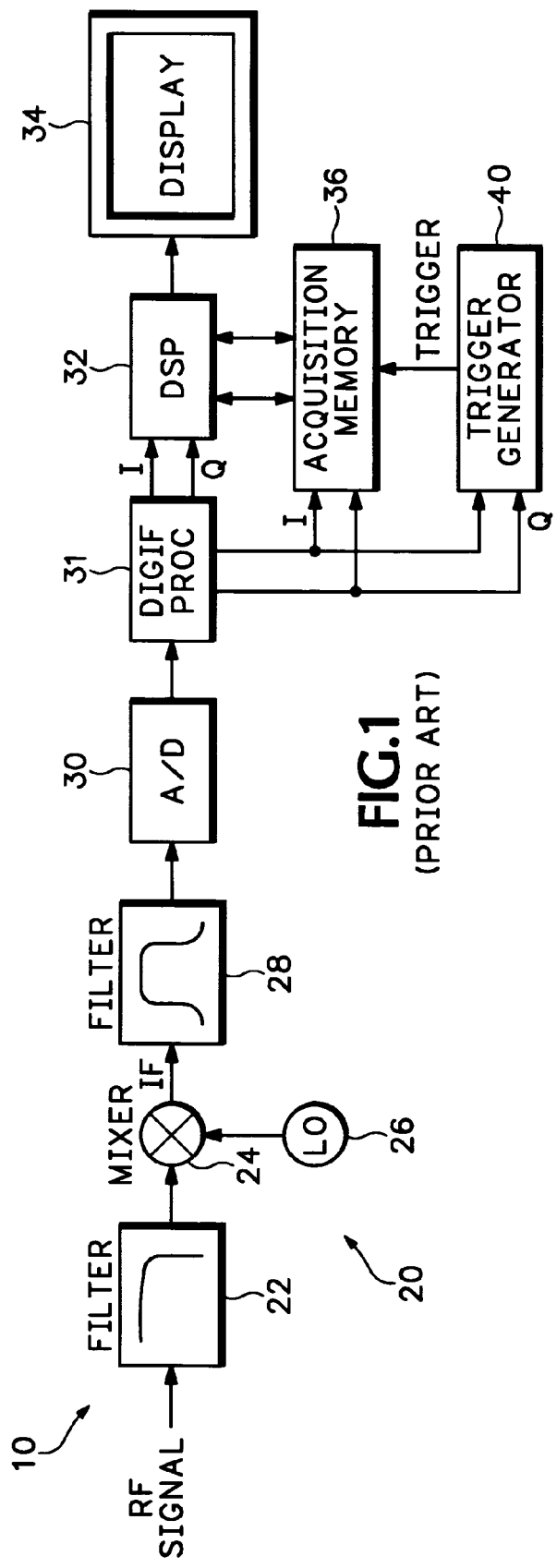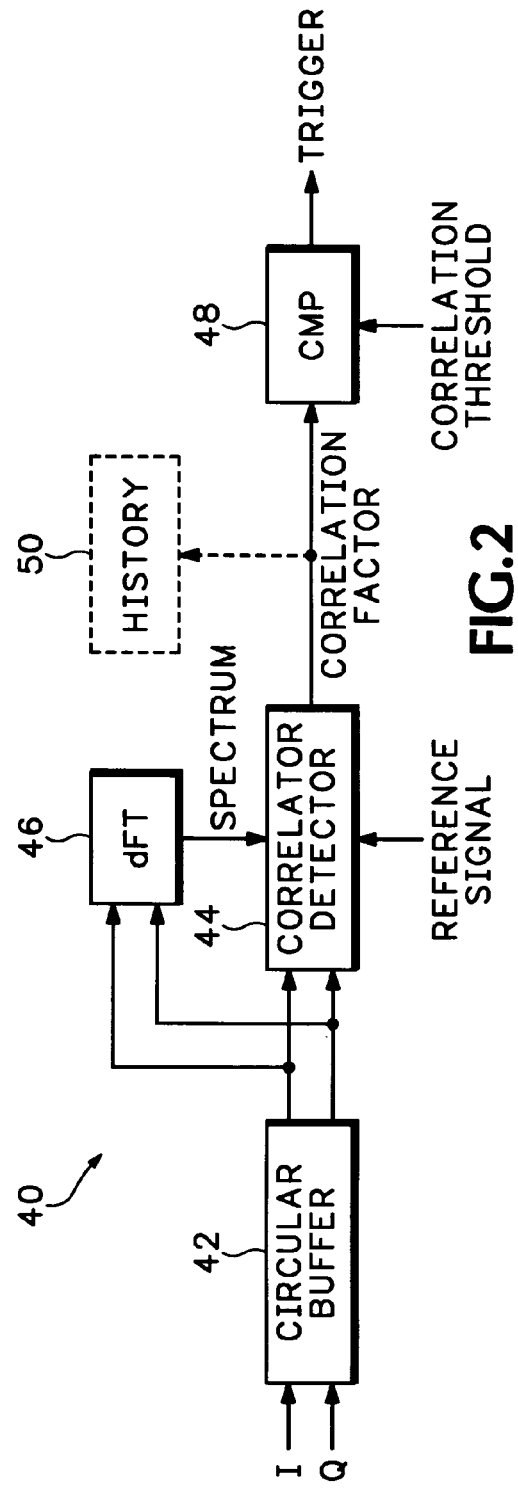

REAL-TIME RF/IF SIGNATURE TRIGGER

BACKGROUND OF THE INVENTION

The present invention relates to signal acquisition, and more particularly to real-time acquisition of RF signals.

Some instruments, such as spectrum analyzers, capture and process received RF signal in real time. For example there currently are several spectrum analyzers on the market, such as the Tektronix WCA200, WCA300, RSA2200 and RSA3300 series real-time spectrum analyzers manufactured by Tektronix, Inc. of Beaverton, Oreg., that capture and analyze seamless blocks of data. Unlike conventional frequency swept spectrum analyzers, no data is missed or lost by these real-time instruments. One function that is performed in real time is called a frequency mask trigger, as described in U.S. Pat. No. 5,103,402. The frequency mask trigger may be implemented with a dedicated fast Fourier transform (FFT) processor that calculates the signal spectrum on the real-time data provided by a receiver system in the real-time instrument. When the calculated spectrum violates a user-defined spectrum (frequency) mask, a predefined block of data representing the received RF signal is stored that provides information on what happened immediately prior and/or after the triggering event. The frequency mask trigger works by comparing each FFT frequency bin in the calculated spectrum with a predefined spectral mask. In this way the frequency mask trigger waits for a specific single spectral event to occur.

More conventional triggers, as in oscilloscopes, operate in the time domain by comparing an input signal amplitude to a predefined amplitude threshold or thresholds, for example. However these "one-dimensional" trigger systems are not adequate to capture complicated signal events. As a result in oscilloscopes complicated time domain trigger functions have been implemented to trigger on different types of signal events.

What is desired is to extend the domain of real-time triggering beyond frequency mask triggering or conventional time-domain (amplitude) triggering to capture more complicated signal events.

BRIEF SUMMARY OF THE INVENTION

Accordingly the present invention provides a real-time RF/IF signature trigger for a real-time instrument by correlating received RF signal data with a reference signal as defined by a signal signature record. The received RF signal data may be time domain RF/IF data, detected RF/IF data, frequency domain RF/IF data, or a combination thereof. The signal signature record may represent a variety of signals, such as desired/undesired RF/IF signal patterns, detected RF pulse shapes, special RF markers used specifically for triggering signal acquisitions, particular signal patterns of interest and the like. The correlation results in a continuously calculated correlation factor in real time that is compared with a variable correlation threshold depending upon the desired use. When the correlation factor reaches, either positively or negatively, the variable correlation threshold indicating the presence of a trigger event, the real-time RF/IF signature trigger is generated for capturing the received RF signal data surrounding the trigger event. The correlation factor also may be saved to provide a history for later analysis of signal behavior over a long time duration.

The objects, advantages and other novel features of the present invention are apparent from the following detailed description when read in conjunction with the appended claims and attached drawing figures.

BRIEF DESCRIPTION OF THE SEVERAL VIEWS OF THE DRAWING

FIG. 1 is a block diagram view of a typical real-time spectrum analyzer according to the prior art.

FIG. 2 is a block diagram view of a trigger generator for the real-time spectrum analyzer according to the present invention.

DETAILED DESCRIPTION OF THE INVENTION

Referring now to FIG. 1 a real-time spectrum analyzer 10 is shown having an input processor 20 for receiving an input RF signal or other signal of interest. The input processor 20 typically includes a lowpass filter 22 followed by a mixer 24 that converts the filtered input signal to an intermediate frequency (IF) signal using a local oscillator 26. The IF signal is passed through a bandpass filter 28 and then input to an analog-to-digital (A/D) converter 30 to provide a digital signal for further processing. The digital signal is input to a digital IF quadrature processor 31 to derive In-phase (I) and Quadrature-phase (Q) signals from the digital signal. The I and Q signals are input to a digital signal processor (DSP) 32 for realtime processing for display on a monitor 34, such as shown in U.S. Pat. No. 4,870,348 which provides a three-dimensional display of frequency vs. time vs. amplitude, also referred to as a spectrogram. The I and Q signals also are input to an acquisition memory 36 and to a trigger generator 40. When the trigger generator 40 detects an event, a trigger is generated that causes the acquisition memory 36 to acquire data from the I and Q signals before and/or after the trigger event for subsequent processing by the DSP 32 or for offloading to another processor (not shown) for non-realtime post-processing.

As shown in FIG. 2, the I and Q signals are input to a circulating buffer 42 from which a time segment or record of the received RF data (I/Q) is read for conversion to a frequency domain signal using a discrete Fourier transform (dFT) 46. The time segment also is input to a correlator 44 together with the frequency domain signal from the dFT 46. A reference signal, which may be a frequency domain reference and/or an I/Q time record reference, also is input to the correlator 44. The I/Q time record and/or the frequency domain signal is correlated with the reference signal in the correlator 44. The time segment may be first subjected to detection, such as envelope, min, max, average, rms and the like, in the correlator 44 to remove the RF/IF component from the I and Q signals prior to correlation. The correlator 44 is configured by a control signal (not shown) to match the input signal(s) with the type of reference signal provided for correlation—frequency domain, time domain (I/Q), detection, etc. A correlation factor is continuously calculated in real time and output to indicate the degree of correlation of the received RF data with the reference signal. The correlation factor is input to a comparator 48 for comparison with a variable correlation threshold. The value of the variable correlation threshold depends upon the degree of correlation desired in order to define a trigger event. If what is desired is to trigger on a signal that is virtually identical to the reference signal, then the correlation threshold is high. Whereas if what is desired is to trigger on a signal that is similar to the reference signal, then the correlation threshold is lower. Also the correlation may be either positive or negative. If the signal is expected to be present and the trigger event is signal drop-out, then the trigger is generated when the correlation factor falls below the correlation threshold. Conversely if the objective is to locate a particular type of signal, then the trigger is generated when the correlation factor rises above the correlation threshold.

Therefore the real-time RF/IF signature trigger is useful for a variety of purposes, such as the following:

- capturing information before, during and after specific signal abnormalities based on RF/IF and/or detected shape or patterns
- capturing signal information at specific times and time intervals based upon an RF marker in the signal
- developing real-time trigger signals for initiating actions based on RF/IF and/or detected signal shape
- real-time identification and signaling of particular signal characteristics/patterns for surveillance purposes
- capturing correlation factors over time for storage and subsequent historical processing as to signal behavior The trigger generator 40 calculates the correlation factor against a specified signature record(s) represented by the reference signal. The signal detection in the correlator 44 may include peak, min, max, average, rms, etc. for correlating to detected signal signatures. The correlation factor is continuously calculated in real time and when the correlation factor reaches a selected threshold, either above or below, the trigger is activated. The signature record representing the reference signal is previously defined, typically by using the same instrument to capture a signal-of-interest for trigger comparison, by designing the signal signature record mathematically or by using some other signal processing tool such as MATLAB to generate the signal signature record. When coupled with the real-time spectrum analyzer receiver system, the RF/IF signature trigger operates over a large frequency range with very high sensitivity and dynamic range.

In addition to developing the trigger the correlation factor may be stored in a history memory 50 to maintain a history of the correlation factor over time in order to analyze signal behavior over long time durations.

Thus the present invention provides an RF/IF signature trigger by correlating received RF signal data with a reference signal defined by a signature record, and generating a trigger for capturing the received RF signal data when the resulting correlation factor reaches a variable correlation threshold, either above or below.

What is claimed is:

1. An apparatus for generating an RF/IF signature trigger comprising:

means for correlating received RF/IF signal data with reference signal data defined by a signal signature record to produce continuously a correlation factor in real time; and means for comparing the correlation factor with a variable correlation threshold to generate the RF/IF signature trigger when the correlation factor reaches the variable correlation threshold.

2. The apparatus as recited in claim 1 wherein the correlating means includes means for performing detection of the received RF/IF signal data to produce detected RF data for correlation with the reference signal data.

3. The apparatus as recited in claim 1 further comprising means for converting the received RF/IF signal data to frequency domain data for correlation with the reference signal data in the correlating means.

4. The apparatus as recited in claim 1 wherein the signal signature record comprises data selected from the group consisting of data derived from a captured signal-of-interest, data derived mathematically and data derived by using a signal processing tool.

5. The apparatus as recited in claim 1 further comprising means for storing the correlation factor over a period of time to provide a history for use in analyzing signal behavior over long time durations.

6. The apparatus as recited in claim 1 wherein the received RF/IF signal data comprises data selected from the group consisting of time domain RF/IF signal data, detected RF/IF signal data and frequency domain RF/IF signal data.

7. The apparatus as recited in claim 6 wherein the correlating means includes means for combining one or more of the time domain RF/IF signal data, detected RF/IF signal data and frequency domain RF/IF signal data as the received RF/IF signal data for correlation with the reference signal.

8. The apparatus as recited in claim 1 wherein the signal signature record comprises data selected from the group consisting of desired/undesired RF/IF signal patterns, detected RF pulse shapes, special RF markers used specifically for triggering signal acquisitions, particular signal patterns of interest and the like.

9. A method of generating an RF/IF signature trigger comprising the steps of:

correlating received RF/IF signal data with reference signal data defined by a signal signature record to produce continuously a correlation factor in real time; and comparing the correlation factor with a variable correlation threshold to generate the RF/IF signature trigger when the correlation factor reaches the variable correlation threshold.

10. The method as recited in claim 9 wherein the correlating step includes the step of performing detection of the received signal data to produce detected RF data for correlation with the reference signal data.

11. The method as recited in claim 9 further comprising the step of converting the received RF/IF signal data to frequency domain data for correlation with the reference signal data in the correlating step.

12. The method as recited in claim 9 wherein the signal signature record comprises data selected from the group consisting of data derived from a captured signal-of-interest, data derived mathematically and data derived by using a signal processing tool.

13. The method as recited in claim 9 further comprising the step of storing the correlation factor over a period of time to provide a history for use in analyzing signal behavior over long time durations.

14. The method as recited in claim 9 wherein the received RF/IF signal data comprises data selected from the group consisting of time domain RF/IF signal data, detected RF/IF signal data and frequency domain RF/IF signal data.

15. The method as recited in claim 14 wherein the correlating step includes the step of combining one or more of the time domain RF/IF signal data, detected RF/IF signal data and frequency domain RF/IF signal data as the received RF/IF signal data for correlation with the reference signal.

16. The method as recited in claim 9 wherein the signal signature record comprises data selected from the group consisting of desired/undesired RF/IF signal patterns, detected RF pulse shapes, special RF markers used specifically for triggering signal acquisitions, particular signal patterns of interest and the like.

17. An apparatus for generating an RF/IF signature trigger comprising:

a correlator for correlating received RF/IF signal data with reference signal data defined by a signal signature record to produce continuously a correlation factor in real time; and a comparator for comparing the correlation factor with a variable correlation threshold to generate the RF/IF signature trigger when the correlation factor reaches the variable correlation threshold.

18. The apparatus as recited in claim 17 wherein the correlator comprises a detector for performing detection of the received RF/IF signal data to produce detected RF data for correlation with the reference signal data.

19. The apparatus as recited in claim 17 further comprising a discrete Fourier transform for converting the received RF/IF signal data to frequency domain data for correlation with the reference signal data.

20. The apparatus as recited in claim 17 wherein the signal signature record comprises data selected from the group consisting of data derived from a captured signal-of-interest, data derived mathematically and data derived by using a signal processing tool.

21. The apparatus as recited in claim 17 further comprising a history memory for storing the correlation factor over a period of time to provide a history for use in analyzing signal behavior over long time durations.

22. The apparatus as recited in claim 17 wherein the received RF/IF signal data comprises data selected from the group consisting of time domain RF/IF signal data, detected RF/IF signal data and frequency domain RF/IF signal data.

23. The apparatus as recited in claim 22 wherein the correlator combines one or more of the time domain RF/IF signal data, detected RF/IF signal data and frequency domain RF/IF signal data as the received RF/IF signal data for correlation with the reference signal.

24. The apparatus as recited in claim 17 wherein the signal signature record comprises data selected from the group consisting of desired/undesired RF/IF signal patterns, detected RF pulse shapes, special RF markers used specifically for triggering signal acquisitions, particular signal patterns of interest and the like.

* * * * *